(12) United States Patent
Jeong et al.

(10) Patent No.: US 9,362,345 B2
(45) Date of Patent: Jun. 7, 2016

(54) ORGANIC LIGHT EMITTING DISPLAY APPARATUS AND METHOD OF MANUFACTURING THE SAME

(71) Applicant: Samsung Display Co., Ltd., Yongin, Gyeonggi-Do (KR)

(72) Inventors: Byoung-Seong Jeong, Yongin (KR); Sang-Yeol Kim, Yongin (KR); Seung-Wook Chang, Yongin (KR); Se-Ho Lee, Yongin (KR); Tae-Hyung Kim, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 133 days.

(21) Appl. No.: 14/012,725

(22) Filed: Aug. 28, 2013

(65) Prior Publication Data
US 2014/0354142 A1  Dec. 4, 2014

(30) Foreign Application Priority Data
May 31, 2013  (KR) .......................... 10-2013-0063082

(51) Int. Cl.
*H01J 1/62* (2006.01)
*H01J 63/04* (2006.01)
*H01L 27/32* (2006.01)

(52) U.S. Cl.
CPC ........ *H01L 27/3276* (2013.01); *H01L 27/3246* (2013.01)

(58) Field of Classification Search
CPC ............ H01L 27/3241; H01L 27/3276; H01L 27/3246
USPC .............. 313/504, 512, 506; 445/24; 428/690
See application file for complete search history.

(56) References Cited

U.S. PATENT DOCUMENTS

| 6,995,035 | B2 | 2/2006 | Cok et al. |
| 7,161,184 | B2 * | 1/2007 | Miyagi ................ G09G 3/3233 257/59 |
| 7,834,543 | B2 * | 11/2010 | Takata ................ H01L 27/3246 313/498 |
| 7,884,542 | B2 * | 2/2011 | Sung .................. H01L 27/1214 313/504 |
| 7,915,811 | B2 | 3/2011 | Kang et al. |
| 2005/0179374 | A1 * | 8/2005 | Kwak ........................... 313/506 |

(Continued)

FOREIGN PATENT DOCUMENTS

| JP | 2005-11810 | 1/2005 |
| KR | 10-2000-065703 | 11/2000 |

(Continued)

*Primary Examiner* — Anh Mai
*Assistant Examiner* — Glenn Zimmerman
(74) *Attorney, Agent, or Firm* — Knobbe, Martens, Olson & Bear LLP

(57) ABSTRACT

An organic light emitting display apparatus and a method of manufacturing the same are disclosed. The organic light emitting display apparatus includes, for example, a pixel electrode and a bus electrode spaced apart and electrically insulated from each other, a pixel defining layer exposing a part of the pixel electrode including a central part thereof and a part of the bus electrode, a first intermediate layer on a top surface of the pixel defining layer between the pixel electrode and the bus electrode, the first intermediate layer having a first opening in a part of the bus electrode to expose a part of the bus electrode, an emission layer disposed on the first intermediate layer, and an opposite electrode disposed on the emission layer to correspond to the pixel electrode and the bus electrode and contacting the bus electrode through the first opening of the first intermediate layer.

13 Claims, 7 Drawing Sheets

(56) References Cited

U.S. PATENT DOCUMENTS

| | | | |
|---|---|---|---|
| 2009/0286445 A1* | 11/2009 | Yamazaki et al. | 445/24 |
| 2009/0295282 A1* | 12/2009 | Yoon et al. | 313/504 |
| 2012/0161174 A1* | 6/2012 | Yamazaki | H01L 27/3204 257/93 |
| 2012/0205678 A1* | 8/2012 | Ikeda et al. | 257/88 |

FOREIGN PATENT DOCUMENTS

| | | |
|---|---|---|
| KR | 10-2004-0106058 | 12/2004 |
| KR | 2005-0027464 | 3/2005 |

\* cited by examiner

ORGANIC LIGHT EMITTING DISPLAY APPARATUS AND METHOD OF MANUFACTURING THE SAME

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57. For example, this application claims the benefit of Korean Patent Application No. 10-2013-0063082, filed on May 31, 2013, in the Korean Intellectual Property Office, the disclosure of which is incorporated herein in its entirety by reference.

BACKGROUND

1. Field

The present disclosure relates to an organic light emitting display apparatus and a method of manufacturing the same, and more particularly, to an organic light emitting display apparatus that may be easily manufactured and has high brightness stability, and a method of manufacturing the same.

2. Description of the Related Technology

Organic light emitting displays have a plurality of pixels, each pixel including an organic light emitting device. The organic light emitting device has a pixel electrode, an opposite electrode facing the pixel electrode, and an intermediate layer interposed between the pixel electrode and the opposite electrode and including an emission layer (EML). The pixel electrode is patterned in each pixel in an island shape, and the opposite electrode is formed integral to the plurality of pixels. However, in some organic light emitting display apparatuses, an IR drop occurs in the opposite electrode and an unintended brightness difference occurs in the plurality of pixels.

SUMMARY OF CERTAIN INVENTIVE ASPECTS

In one aspect, an organic light emitting display apparatus is provided that may be easily manufactured and has high luminous stability.

In another aspect, a method of manufacturing an organic light emitting display apparatus is provided.

In another aspect, an organic light emitting display apparatus is provided, including, for example, a pixel electrode and a bus electrode formed on a same layer, spaced apart and electrically insulated from each other, a pixel defining layer formed on the same layer so that at least a part of the pixel electrode including a central part thereof and at least a part of the bus electrode are exposed, a first intermediate layer formed on a top surface of the pixel defining layer between the pixel electrode and the bus electrode, on the pixel electrode, and on the bus electrode, the first intermediate having a first opening in a part of the bus electrode so that at least a part of the bus electrode is exposed, an emission layer formed on the first intermediate layer to correspond to the pixel electrode, and an opposite electrode formed on the emission layer to correspond to the pixel electrode and the bus electrode, the opposite electrode contacting the bus electrode through the first opening of the first intermediate layer.

In some embodiments, only a part of the bus electrode may be exposed through the first opening of the first intermediate layer. In some embodiments, a portion of the first intermediate layer adjacent to the first opening may be a portion deteriorated through exposure to high-temperature heat. In some embodiments, the organic light emitting display apparatus may further include an auxiliary opposite electrode formed on a surface toward the first intermediate layer of the opposite electrode to contact the opposite electrode, the auxiliary opposite electrode having a third opening corresponding to the first opening of the first intermediate layer. In some embodiments, a thickness of the auxiliary opposite electrode may be smaller than the thickness of the opposite electrode. In some embodiments, the auxiliary opposite electrode may correspond to the opposite electrode in a portion of the first intermediate layer not including the first opening. In some embodiments, a thickness of a portion of the opposite electrode corresponding to the first opening of the first intermediate layer may be smaller than the thickness of another portion of the opposite electrode.

In some embodiments, the organic light emitting display apparatus may further include a second intermediate layer formed between the first intermediate layer and the opposite electrode to cover the first intermediate layer and the emission layer. In some embodiments, the second intermediate layer has a second opening corresponding to the first opening of the first intermediate layer so that the opposite electrode contacts the bus electrode through the first opening and the second opening. In some embodiments, the second opening may be larger than the first opening. In some embodiments, a center of the second opening and a center of the first opening are substantially aligned with each other when viewed in a direction substantially normal to the first and the second opening. In some embodiments, a portion of the second intermediate layer adjacent to the second opening may be a portion that is deteriorated by exposure to heat. In some embodiments, the second intermediate layer may include at least one of LiF and Liq.

In another aspect, a method of manufacturing an organic light emitting display apparatus is provided that includes, for example, forming a pixel electrode and a bus electrode on a same layer to be spaced apart and electrically insulated from each other, forming a pixel defining layer on the same layer so that at least a part of the pixel electrode including a central part thereof and at least a part of the bus electrode are exposed, forming a first intermediate layer on a top surface of the pixel defining layer between the pixel electrode and the bus electrode, on the pixel electrode, and on the bus electrode, forming an emission layer on the first intermediate layer to correspond to the pixel electrode, forming a first opening by removing a portion of the first intermediate layer on the bus electrode so that at least a part of the bus electrode is exposed, and forming an opposite electrode corresponding to the pixel electrode and the bus electrode to contact the bus electrode through the first opening of the first intermediate layer.

In some embodiments, the forming of the first opening may include forming the first opening through which only a part of the bus electrode is exposed. In some embodiments, the forming of the first opening may be achieved by irradiating a laser beam onto the first intermediate layer. In some embodiments, the method may further include, between the forming of the emission layer and the forming of the first opening: forming an auxiliary opposite electrode corresponding to the pixel electrode and the bus electrode. In some embodiments, the first opening in the first intermediate layer is formed along with a third opening in the auxiliary opposite electrode by removing a portion of the first intermediate layer on the bus electrode and a portion of the auxiliary opposite electrode on the bus electrode so that at least a part of the bus electrode is exposed. In some embodiments, the opposite electrode is formed to correspond to the pixel electrode and the bus electrode to contact the bus electrode through the first opening in the first intermediate layer and the third opening in the auxiliary opposite electrode. In some embodiments, the first opening in the first intermediate layer and the third opening in the auxiliary opposite electrode may be simultaneously formed by irradiating a laser beam onto the auxiliary opposite electrode. In some embodiments, the opposite electrode may be formed to be thicker than the auxiliary opposite electrode.

In some embodiments, the method may further include, between the forming of the emission layer and the forming of the first opening, forming a second intermediate layer to cover the first intermediate layer and the emission layer. In some embodiments, the first opening in the first intermediate layer is formed along with a second opening in the second intermediate layer by removing a portion of the first intermediate layer on the bus electrode and a portion of the second intermediate layer on the bus electrode so that at least a part of the bus electrode is able to be exposed; and the opposite electrode is formed to correspond to the pixel electrode and the bus electrode to contact the bus electrode through the first opening of the first intermediate layer and the second opening of the second intermediate layer. In some embodiments, the first opening in the first intermediate layer and the second opening in the second intermediate layer may be simultaneously formed by irradiating a laser beam onto the second intermediate layer.

In another aspect, a method of manufacturing an organic light emitting display apparatus is provided that includes, for example, forming a pixel electrode and a bus electrode on a same layer to be spaced apart and electrically insulated from each other, forming a pixel defining layer on the same layer so that at least a part of the pixel electrode including a central part thereof and at least a part of the bus electrode are exposed, forming a first intermediate layer on a top surface of the pixel defining layer between the pixel electrode and the bus electrode, on the pixel electrode, and on the bus electrode, forming an emission layer on the first intermediate layer to correspond to the pixel electrode, forming an opposite electrode corresponding to the pixel electrode and the bus electrode, and irradiating a laser beam onto at least a part of the opposite electrode corresponding to the bus electrode so that at least a part of the first intermediate layer between the opposite electrode and the bus electrode is removed and the opposite electrode and the bus electrode contact each other.

BRIEF DESCRIPTION OF THE DRAWINGS

Features of the present disclosure will become more fully apparent from the following description and appended claims, taken in conjunction with the accompanying drawings. It will be understood these drawings depict only certain embodiments in accordance with the disclosure and, therefore, are not to be considered limiting of its scope; the disclosure will be described with additional specificity and detail through use of the accompanying drawings. An apparatus, system or method according to some of the described embodiments can have several aspects, no single one of which necessarily is solely responsible for the desirable attributes of the apparatus, system or method. After considering this discussion, and particularly after reading the section entitled "Detailed Description of Certain Inventive Embodiments" one will understand how illustrated features serve to explain certain principles of the present disclosure.

DETAILED DESCRIPTION OF CERTAIN INVENTIVE EMBODIMENTS

Figure 1:
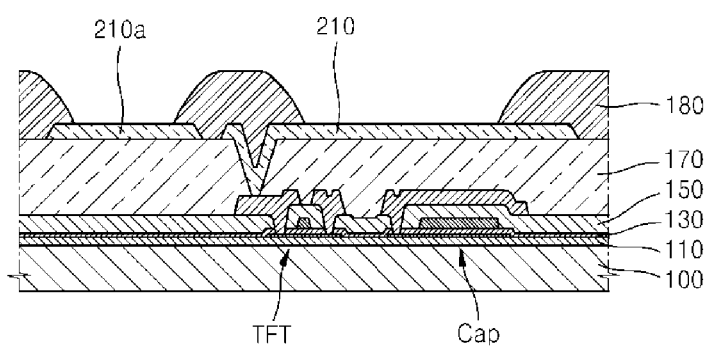
FIGS. 1 through 7 are cross-sectional views schematically illustrating processes of a method of manufacturing an organic light emitting display apparatus.

Reference will now be made in detail to exemplary embodiments, examples of which are illustrated in the accompanying drawings. However, exemplary embodiments are not limited to the embodiments illustrated hereinafter, and the embodiments herein are rather introduced to provide easy and complete understanding of the scope and spirit of exemplary embodiments. In the drawings, elements may be exaggerated or reduced for conveniences of explanation. For example, the sizes and the thicknesses of elements are arbitrarily shown for convenience of explanation and thus, the present disclosure is not limited thereto. It will be understood that when an element, such as a layer, a region, or a substrate, is referred to as being "on", "connected to" or "coupled to" another element, it may be directly on, connected or coupled to the other element, or intervening elements may be present. As used herein, the term "and/or" includes any and all combinations of one or more of the associated listed items. Expressions such as "at least one of," when preceding a list of elements, modify the entire list of elements and do not modify the individual elements of the list.

FIGS. 1 through 7 are cross-sectional views schematically illustrating processes of a method of manufacturing an organic light emitting display apparatus, according to embodiments of the present disclosure.

First, in some embodiments as illustrated in FIG. 1, a pixel electrode 210 and a bus electrode 210a are formed on the same layer. The pixel electrode 210 and the bus electrode 210a are spaced apart and electrically insulated from each other. In FIG. 1, the pixel electrode 210 and the bus electrode 210a are formed on a planarization layer 170. However, aspects of the present disclosure are not limited thereto.

Prior to forming the pixel electrode 210 and the bus electrode 210a, various layers may be formed. In the drawings, a thin film transistor TFT and a capacitor Cap are formed on a substrate 100, the planarization layer 170 is formed to cover the thin film transistor TFT and the capacitor Cap, and then, the pixel electrode 210 and the bus electrode 210a are formed on the planarization layer 170.

The substrate 100 may be formed from one of various materials including a glass material, a metal material, and a plastic material, such as polyethylene terephthalate (PET), polyethylene naphthalate (PEN), or polyimide. A buffer layer 110 formed on the substrate 100 to prevent impurities from permeating a semiconductor layer of the thin film transistor TFT, a gate insulating layer 130 is formed on the buffer layer 110 to insulate the semiconductor layer and the gate electrode of the thin film transistor TFT from each other, an interlayer dielectric (ILD) layer 150 is formed on the gate insulating layer 130 to insulate a source electrode/drain electrode and the gate electrode of the thin film transistor TFT from each other, and the planarization layer 170 is formed on the interlayer dielectric (ILD) layer 150 to cover the thin film transistor TFT. The planarization layer 170 has an approximately flat top surface. Other elements may be formed on the buffer layer 110.

The pixel electrode 210 and the bus electrode 210a may be (semi-)transparent electrodes or reflection electrodes. When the pixel electrode 210 and the bus electrode 210a are (semi-) transparent electrodes, the pixel electrode 210 and the bus electrode 210a may be formed from, for example, an indium tin oxide (ITO), an indium zinc oxide (IZO), a zinc oxide (ZnO), an indium oxide ($In_2O_3$), an indium gallium oxide (IGO), or an aluminum zinc oxide (AZO). When the pixel electrode 210 and the bus electrode 210a are reflection electrodes, a reflection layer may be formed from Ag, Mg, Al, Pt, Pd, Au, Ni, Nd, Ir, Cr, or a combination thereof, and a layer formed from ITO, IZO, ZnO or $In_2O_3$ may be formed on the reflection layer. The pixel electrode 210 and the bus electrode 210a may be simultaneously formed from the same material.

Subsequently, a pixel defining layer 180 is formed on the same layer as the pixel electrode 210 and the bus electrode 210a so that at least a part of the pixel electrode 210 including a central part thereof and at least a part of the bus electrode 210a may be exposed. The pixel defining layer 180 has an opening corresponding to each subpixel, for example, an opening through which at least a part of the pixel electrode 210 including the central part thereof is exposed, thereby defining pixels. The pixel defining layer 180 causes a distance between an end of the pixel electrode 210 and an opposite electrode (not shown) at an upper portion of the pixel electrode 210 that will be formed later to increase, thereby preventing an arc from occurring at the end of the pixel electrode 210.

Figure 2:
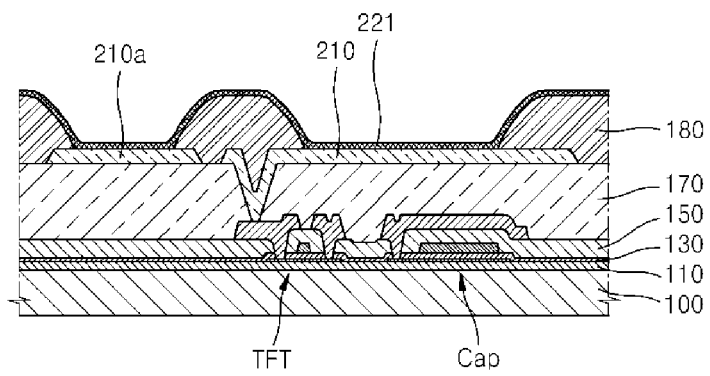

Subsequently, in some embodiments as illustrated in FIG. 2, a first intermediate layer 221 is formed on a top surface of the pixel defining layer 180 between the pixel electrode 210 and the bus electrode 210a, the pixel electrode 210, and the bus electrode 210a. That is, the first intermediate layer 221 may be formed so that the top surface of the pixel defining layer 180 between the pixel electrode 210 and the bus electrode 210a, the pixel electrode 210, and the bus electrode 210a may be formed integrally with one another in a plurality of pixels.

In some embodiments, the first intermediate layer 221 may have a single layer structure or a multi-layered structure. For example, when the first intermediate layer 221 is formed from a polymer material, the first intermediate layer 221 is a hole transport layer (HTL) having a single layer structure and may be formed from poly-(3,4)-ethylene-dihydroxy thiophene (PEDOT) or polyaniline (PANI). When the first intermediate layer 221 is formed from a low molecular material, the first intermediate layer 221 may include a hole injection layer (HIL) and a HTL.

Figure 3:
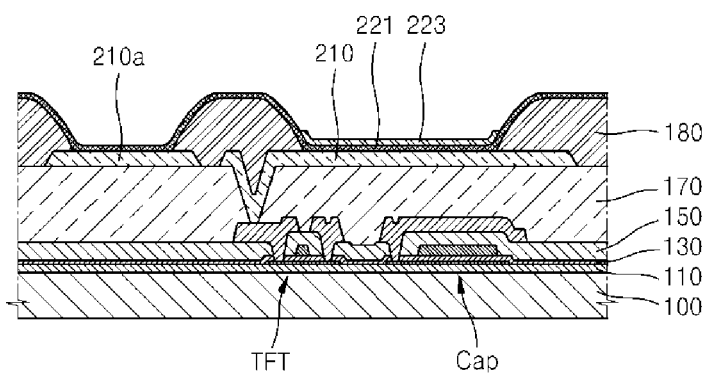

Subsequently, as illustrated in FIG. 3, an emission layer (EML) 223 is formed on the first intermediate layer 221 to correspond to the pixel electrode 210.

Figure 4:
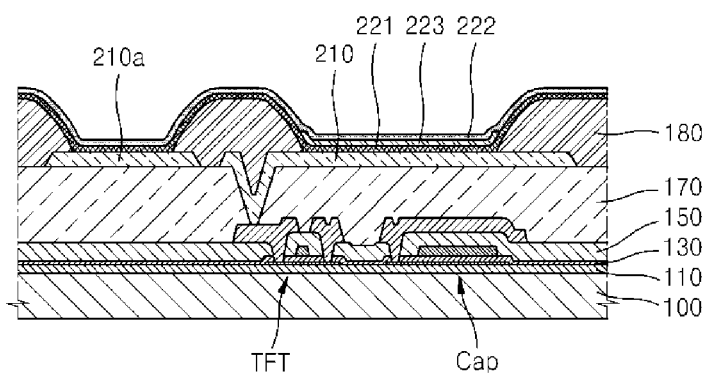

Subsequently, in some embodiments as illustrated in FIG. 4, a second intermediate layer 222 is formed to cover the first intermediate layer 221 and the emission layer (EML) 223. Obviously, the second intermediate layer 222 is not necessarily formed, and for example, when the first intermediate layer 221 and the EML 223 are formed from a polymer material, the second intermediate layer 222 may not be formed. When the first intermediate layer 221 and the EML 223 are formed from a low molecular material, the second intermediate layer 222 may be formed so that an organic light emitting device has superior characteristics. In some embodiments, the second intermediate layer 222 may have a single layer structure or a multi-layered structure. The second intermediate layer 222 may include an electron transport layer (ETL) and/or an electron injection layer (EIL).

Figure 5:
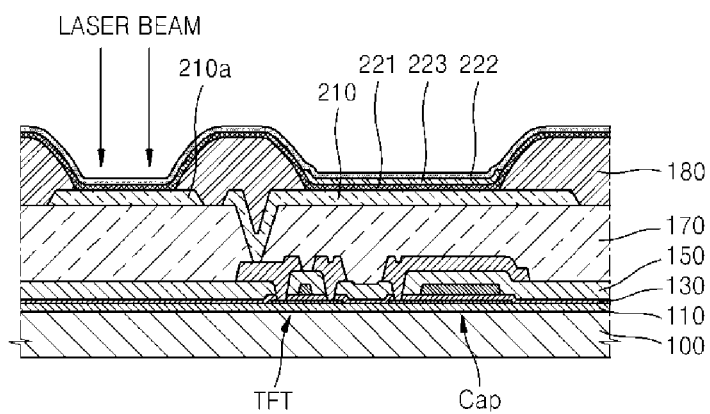
Figure 6:
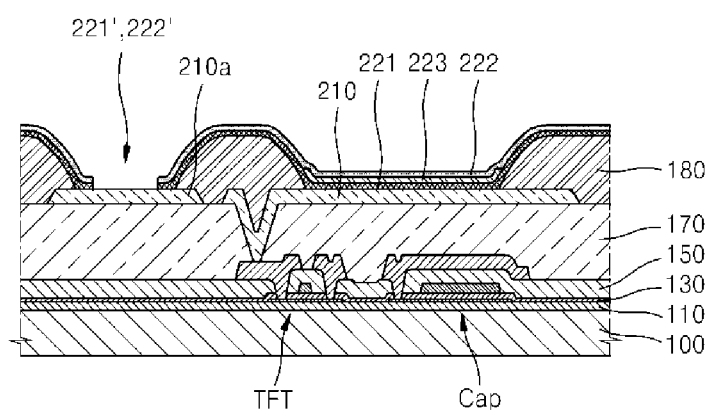

In some embodiments, after the second intermediate layer 222 is formed as illustrated in FIG. 6, a part of the first intermediate layer 221 on the bus electrode 210a and a part of the second intermediate layer 222 on the bus electrode 210a are removed so that a first opening 221' of the first intermediate layer 221 and a second opening 222' of the second intermediate layer 222 may be formed. As a result, at least a part of the bus electrode 210a may be exposed. To this end, as illustrated in FIG. 5, a laser beam is irradiated onto the second intermediate layer 222 so that the first opening 221' of the first intermediate layer 221 and the second opening 222' of the second intermediate layer 222 may be simultaneously formed.

Figure 7:
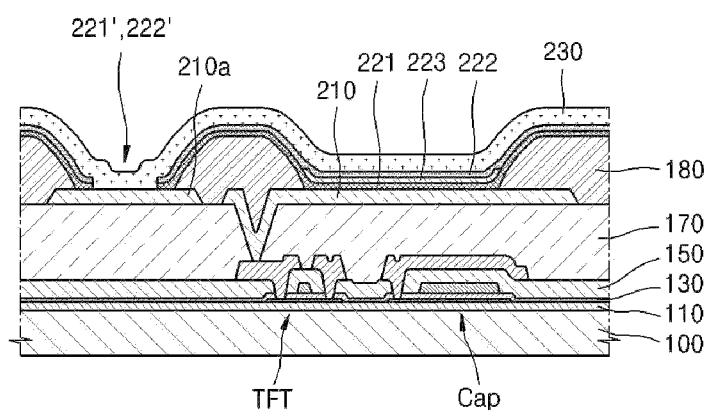

Subsequently, in some embodiments as illustrated in FIG. 7, an opposite electrode 230 corresponding to the pixel electrode 210 and the bus electrode 210a is formed to contact the bus electrode 210a through the first opening 221' of the first intermediate layer 221 and the second opening 222' of the second intermediate layer 222. The opposite electrode 230 may be formed as an integral part in a plurality of pixels and may cover a display region (active region). The display region means all regions of the entire organic light emitting display apparatus in which light may be emitted, for example, all regions excluding edges of the organic light emitting display apparatus in which a controller is to be disposed. Obviously, when a dead area does not exist in the entire surface of the organic light emitting display apparatus, the entire surface of the organic light emitting display apparatus may be the display region.

The opposite electrode 230 may contact electrode power supply lines outside the display region and may receive electrical signals from the electrode power supply lines. The opposite electrode 230 may be a (semi-)transparent electrode or a reflection electrode. When the opposite electrode 230 is a (semi-)transparent electrode, a layer may be formed from Li, Ca, LiF/Ca, LiF/Al, Al, Mg, or a combination thereof, a layer may be formed from a (semi-)transparent material, such as ITO, IZO, ZnO, or $In_2O_3$ on the layer so that the opposite electrode 230 may be formed as the (semi-)transparent electrode. When the opposite electrode 230 is a reflection electrode, a layer may be formed from at least one from among Li, Ca, LiF/Ca, LiF/Al, Al, Ag, and Mg so that the opposite electrode 230 may be formed as the reflection electrode. Obviously, the configuration and material of the opposite electrode 230 are not limited thereto, and various modifications like forming the opposite electrode 230 of other materials or forming the opposite electrode 230 to have a multi-layered structure are possible.

In the method of manufacturing the organic light emitting display apparatus according to the current embodiment of the present disclosure, after the bus electrode 210a is formed, the opposite electrode 130 contacts the bus electrode 210a, and electrical signals are transmitted to the opposite electrode 230 via the bus electrode 210a having high electrical conductivity. Thus, an IR drop that may occur in the opposite electrode 230 when no bus electrode 210a is present may be prevented or minimized. Thus, an unintended brightness difference may be prevented from being generated in the plurality of pixels, or even when the unintended brightness difference is generated, the brightness difference may be minimized.

To allow the opposite electrode 230 and the bus electrode 210a to contact each other, as illustrated in FIG. 7, at least a part of the bus electrode 210a need not be covered by the first intermediate layer 221 and the second intermediate layer 222.

To this end, from a time when the first intermediate layer 221 and the second intermediate layer 222 are initially formed, the first intermediate layer 221 and the second intermediate layer 222 may not be formed on at least a part of the bus electrode 210a. However, in this case, a mask must be used to form the first intermediate layer 221 and the second intermediate layer 222. Thus, a manufacturing process may be complicated when the mask and the substrate 100 need to be precisely aligned.

However, in the method of manufacturing the organic light emitting display apparatus according to the current embodiment of the present disclosure, the first intermediate layer 221 and the second intermediate layer 222 are formed on the entire surface of the substrate 100, and only portions of the first intermediate layer 221 and the second intermediate layer 222 on at least a part of the bus electrode 210a are selectively removed using the laser beam so that manufacturing efficiency may be remarkably improved.

Figure 8:
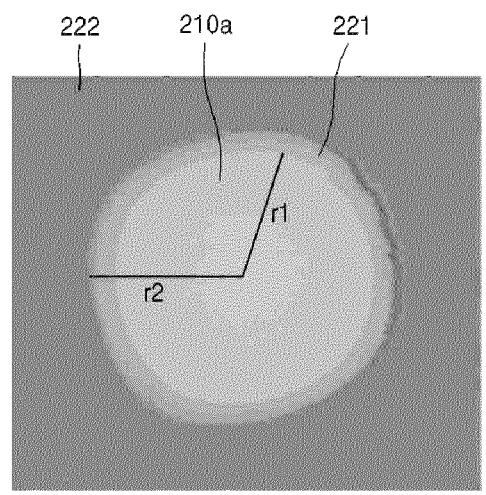
FIG. 8 is a photo schematically showing a part of the organic light emitting display apparatus illustrated in FIG. 6.

FIG. 8 is a photo schematically showing a part of the organic light emitting display apparatus illustrated in FIG. 6. In some embodiments as illustrated in FIG. 8, as the laser beam is irradiated onto the second intermediate layer 222, portions of the first intermediate layer 221 and the second intermediate layer 222 are removed so that a part of the bus electrode 210a may be exposed. As the laser beam is directly irradiated onto the second intermediate layer 222, as illustrated in FIG. 8, the second opening 222' of the second intermediate layer 222 onto which the laser beam is directly irradiated may be larger than the first opening 221' of the first intermediate layer 221. In FIG. 8, the first opening 221' and the second opening 222' have approximately circular shapes, and a radius r2 of the second opening 222' may be larger than a radius r1 of the first opening 221'.

As described above, if the second intermediate layer 222 is not formed, the laser beam is directly irradiated onto the first intermediate layer 221, a part of the first intermediate layer 221 on the bus electrode 210a is removed so that at least a part of the bus electrode 210a may be exposed, thereby forming the first opening 221'. When the opposite electrode 230 is formed, the opposite electrode 230 corresponding to the pixel electrode 210 and the bus electrode 210a is formed to contact the bus electrode 210a via the first opening 221' of the first intermediate layer 221.

When the first opening 221' and/or the second opening 222' is formed, as illustrated in FIG. 8, only a part of the bus electrode 210a may be exposed. For example, a plurality of first openings 221' and/or second openings 222' having approximately circular shapes as illustrated in FIG. 8 are formed in the display region of the organic light emitting display region so that the opposite electrode 230 may contact a plurality of the bus electrodes 210a.

FIGS. 9 through 12 are cross-sectional views schematically illustrating processes of a method of manufacturing an organic light emitting display apparatus, according to other embodiments of the present disclosure.

Figure 9:
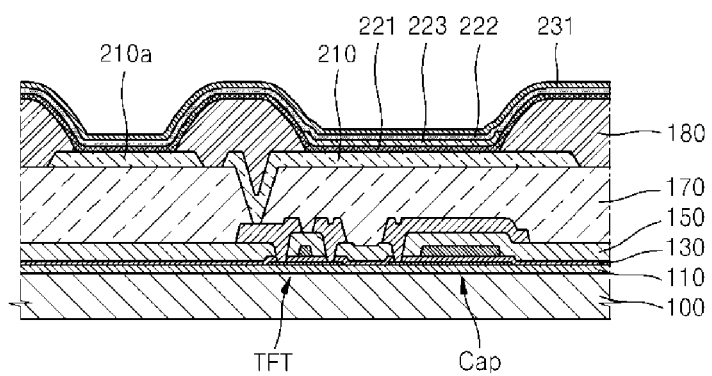
FIGS. 9 through 12 are cross-sectional views schematically illustrating processes of a method of manufacturing an organic light emitting display apparatus.

In the method of manufacturing the organic light emitting display apparatus according to the current embodiment of the present disclosure, as described above with reference to FIGS. 1 through 4, the second intermediate layer 222 is formed, and in some embodiments as illustrated in FIG. 9, an auxiliary opposite electrode 231 corresponding to the pixel electrode 210 and the bus electrode 210a is formed. That is, the auxiliary opposite electrode 231 is formed to cover the second intermediate layer 222. If the second intermediate layer 222 is not formed, the auxiliary opposite electrode 231 may be formed to cover the first intermediate layer 221 and the EML 223. A material for forming the auxiliary opposite electrode 231 may be one of the above-described materials used for forming the opposite electrode 230, for example.

Figure 10:
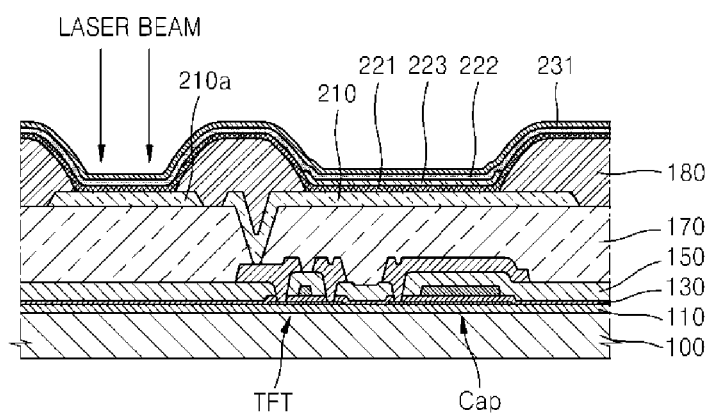
Figure 11:
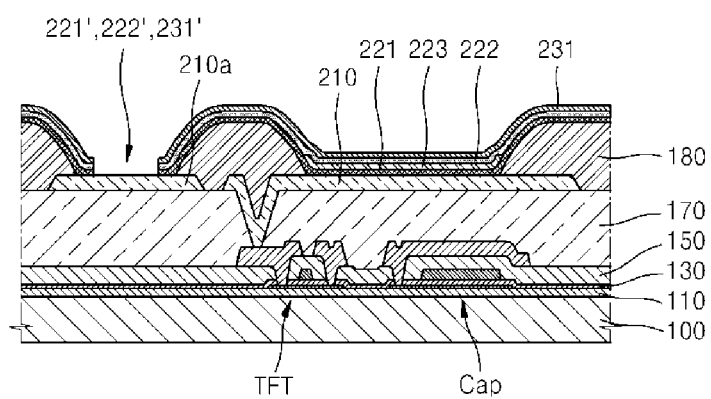

Subsequently, in some embodiments as illustrated in FIG. 10, the laser beam is irradiated onto the auxiliary opposite electrode 231, and the first opening 221' of the first intermediate layer 221, the second opening 222' of the second intermediate layer 222, and a third opening 231' of the auxiliary opposite electrode 231 are simultaneously formed, in some embodiments as illustrated in FIG. 11. Obviously, if the second intermediate layer 222 is not formed, the laser beam is irradiated onto the auxiliary opposite electrode 231 so that the first opening 221' of the first intermediate layer 221 and the third opening 231' of the auxiliary opposite electrode 231 may be simultaneously formed.

Figure 12:
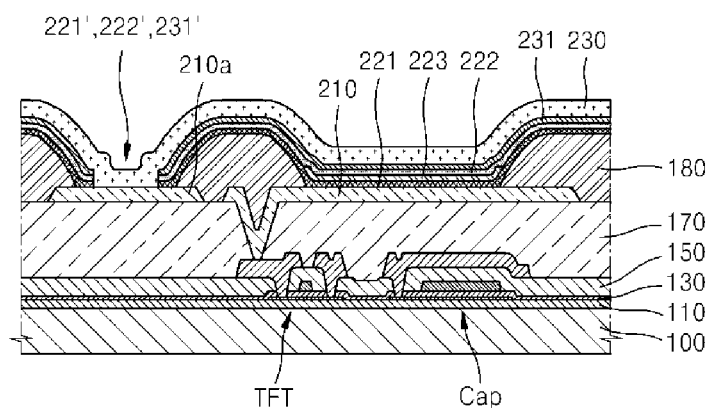

Subsequently, in some embodiments as illustrated in FIG. 12, the opposite electrode 230 corresponding to the pixel electrode 210 and the bus electrode 210a is formed to contact the bus electrode 210a through the first opening 221' of the first intermediate layer 221, the second opening 222' of the second intermediate layer 222, and the third opening 231' of the auxiliary opposite electrode 231. Even in this case, the opposite electrode 230 may be formed as an integral part in the plurality of pixels and may cover the display region (active region).

In the method of manufacturing the organic light emitting display apparatus according to the present embodiment, the bus electrode 210a is formed, and the opposite electrode 230 contacts the bus electrode 210a, and electrical signals are transmitted to the opposite electrode 230 via the bus electrode 210a having high electrical conductivity. Thus, an IR drop that may occur when no bus electrode 210a is present may be prevented or minimized. Thus, an unintended brightness difference may be prevented from being generated in the plurality of pixels, or even when the unintended brightness difference is generated, the brightness difference may be minimized.

The first intermediate layer 221 and/or the second intermediate layer 222 is formed on the entire surface of the substrate 100, and only portions of the first intermediate layer 221 and the second intermediate layer 222 on at least a part of the bus electrode 210a are selectively removed using the laser beam to allow the opposite electrode 230 and the bus electrode 210a to contact each other. Thus, manufacturing efficiency may be significantly improved when compared similar processes known in the art.

In the method of manufacturing the organic light emitting display apparatus according to the present embodiment, if the second intermediate layer 222 is not formed using the auxiliary opposite electrode 231, the first intermediate layer 221 and the EML 223 are covered and then the laser beam is irradiated onto the auxiliary opposite electrode 231. The laser beam is irradiated onto the auxiliary opposite electrode 231 in a state in which the first intermediate layer 221 that is vulnerable to an impurity from the outside, the second intermediate layer 222 and/or the EML 223 are covered with the auxiliary opposite electrode 231. Thus, compared to the case when the laser beam is irradiated onto the first intermediate layer 221 and/or the second intermediate layer 222 without covering the auxiliary opposite electrode 231, damage of the first intermediate layer 221, the second intermediate layer 222 and/or the EML 223 may be minimized, and the occurrence of a manufacturing defect may be remarkably reduced.

In the method of manufacturing the organic light emitting display apparatus, the laser beam is irradiated onto the auxiliary opposite electrode 231, thereby removing a part of the auxiliary opposite electrode 231. Thus, the auxiliary opposite electrode 231 may be formed with a small thickness so that the part of the auxiliary opposite electrode 231 may be easily removed. If light generated in the EML 223 is irradiated to the outside through the substrate 100, the opposite electrode 230 may be formed with a sufficient large thickness in consideration of electrical conductivity. As a result, the opposite electrode 230 may be formed thicker than the auxiliary opposite electrode 231.

Figure 13:
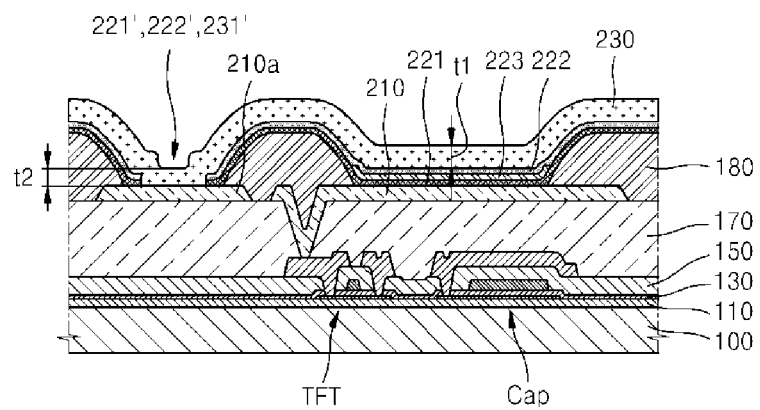
FIG. 13 is a cross-sectional view schematically illustrating an organic light emitting display apparatus that is manufactured by a method of manufacturing an organic light emitting display apparatus.

When the auxiliary opposite electrode 231 and the opposite electrode 230 are formed from the same material, a boundary between the auxiliary opposite electrode 231 and the opposite electrode 230 may not occur in a final product according to a process condition. In some embodiments, the auxiliary opposite electrode 231 and the opposite electrode 230 may be referred to the opposite electrode 230. As illustrated in FIG. 13, a thickness t1 of another portion of the opposite electrode 230, for example, the thickness t1 of a portion of the pixel electrode 210 is larger than the thickness t2 of a portion of the opposite electrode 230 where the opposite electrode 230 contacts the bus electrode 210a. This is because, in the portion of the pixel electrode 210, the opposite electrode 230 is formed twice and in the portion of the bus electrode 210a, the opposite electrode 230 is formed once.

Figure 14:
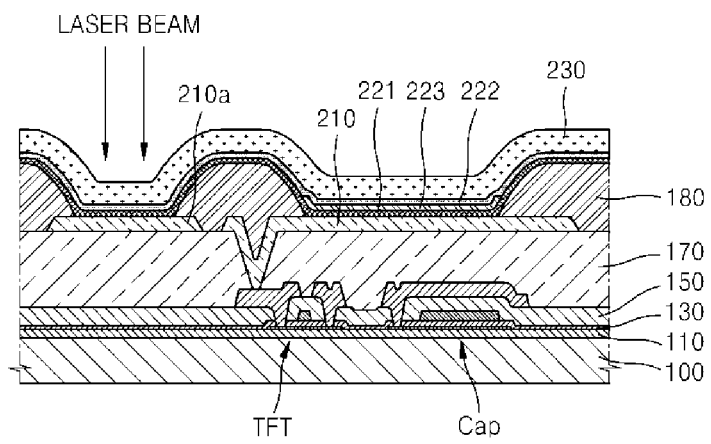
FIG. 14 is a cross-sectional view schematically illustrating one process of the method of manufacturing an organic light emitting display apparatus illustrated in FIG. 13.

FIG. 14 is a cross-sectional view schematically illustrating one process of the method of manufacturing an organic light emitting display apparatus illustrated in FIG. 13. In the method of manufacturing the organic light emitting display apparatus illustrated in FIG. 13, the first intermediate layer 221, the EML 223 and/or the second intermediate layer 222 are formed as illustrated in FIG. 9, and the opposite electrode 230 is formed on the entire surface of the display unit as illustrated in FIG. 14. Next, a laser beam is irradiated onto at least a part of the opposite electrode 230 corresponding to the bus electrode 210a so that at least a part of the first intermediate layer 221 and/or the second intermediate layer 222 between the opposite electrode 230 and the bus electrode 210a is removed and the opposite electrode 230 and the bus electrode 210a contact each other. At least a part of the first intermediate layer 221 and/or the second intermediate layer 222 between the opposite electrode 230 and the bus electrode 210a is removed to generate heat in the opposite electrode 230 by the laser beam irradiated onto the opposite electrode 230 and to remove the first intermediate layer 221 and/or the second intermediate layer 222 between the opposite electrode 230 and the bus electrode 210a due to heat.

Until now, the method of manufacturing the organic light emitting display apparatus has been described. However, aspects of the present disclosure are not limited thereto. For example, the organic light emitting display apparatus manufactured using the method is also within the scope of the present disclosure.

For example, the organic light emitting display apparatus according to an embodiment of the present disclosure may have the configuration illustrated in FIG. 7.

The organic light emitting display apparatus according to the present embodiment includes a pixel electrode 210 and a bus electrode 210a formed on the same layer, are spaced apart and electrically insulated from each other, a pixel defining layer 180 formed on the same layer so that at least a part of the pixel electrode 210 including a central part thereof and at least a part of the bus electrode 210a may be exposed, and an opposite electrode 230 formed corresponding to the pixel electrode 210 and the bus electrode 210a and contacts the bus electrode 210a.

The organic light emitting display apparatus according to the present embodiment further includes a first intermediate layer 221 and a second intermediate layer 222. The first intermediate layer 221 and the second intermediate layer 222 are formed on a top surface of the pixel defining layer 180 between the pixel electrode 210 and the bus electrode 210a and on the pixel electrode 210 and the bus electrode 210a. Obviously, an emission layer (EML) 223 may be interposed between the first intermediate layer 221 and the second intermediate layer 222 to correspond to the pixel electrode 210. In some embodiments, in order to allow the bus electrode 210a and the opposite electrode 230 to contact each other, the first intermediate layer 221 and the second intermediate layer 222 have a first opening 221' and a second opening 222' in portions of the bus electrode 210a so that at least a part of the bus electrode 210a may be exposed. Obviously, the second intermediate layer 222 may not be formed depending on the occasion.

The organic light emitting display apparatus according to the present embodiment includes the bus electrode 210a, and the opposite electrode 230 contacts the bus electrode 210a. In operation electrical signals are transmitted to the opposite electrode 230 via the bus electrode 210a having high electrical conductivity so that IR drop that may occur in the opposite electrode 230 when no bus electrode 210a is present may be prevented or minimized. Thus, an unintended brightness difference may be prevented from being generated in the plurality of pixels, or even when the unintended brightness difference is generated, the brightness difference may be minimized.

As described above, to allow the opposite electrode 230 and the bus electrode 210a to contact each other, the first intermediate layer 221 and/or the second intermediate layer 222 have the first opening 221' and/or the second opening 222' so that at least a part of the bus electrode 210a may be exposed. The first opening 221' or the second opening 222' may be formed by forming the first intermediate layer 221 and/or the second intermediate layer 222 on the entire surface of the substrate 100, by irradiating a laser beam onto predetermined portions of the first intermediate layer 221 and/or the second intermediate layer 222 and by removing at least a part of the portions onto which the laser beam is irradiated so that a manufacturing yield may be improved. Thus, in the organic light emitting display apparatus according to the present embodiment, a portion of the first intermediate layer 221 adjacent to the first opening 221' may be a portion that has deteriorated by exposure to a high-temperature heat. This also applies to the second opening 222' of the second intermediate layer 222.

FIG. 8 is a photo schematically showing a part of the organic light emitting display apparatus illustrated in FIG. 6. In some embodiments as illustrated in FIG. 8, as the laser beam may be irradiated onto the first intermediate layer 221 and the second intermediate layer 222, portions of the first intermediate layer 221 and the second intermediate layer 222 are removed so that a part of the bus electrode 210a may be exposed. As the laser beam is directly irradiated onto the second intermediate layer 222, as illustrated in FIG. 8, the second opening 222' of the second intermediate layer 222 onto which the laser beam is directly irradiated, is larger than the first opening 221' of the first intermediate layer 221. In FIG. 8, the first opening 221' and the second opening 222' have approximately circular shapes, and a radius r2 of the second opening 222' is larger than a radius r1 of the first opening 221'. The first opening 221' and the second opening 222' are simultaneously formed so that their centers are substantially aligned with each other when viewed in a direction substantially normal to each opening.

When the first opening 221' and/or the second opening 222' is formed, only a part of the bus electrode 210a may be exposed, as illustrated in FIG. 8. For example, a plurality of first openings 221' and/or second openings 222' having approximately circular shapes illustrated in FIG. 8 are formed in a display region of the organic light emitting display apparatus so that the opposite electrode 230 may contact a plurality of the bus electrodes 210a.

The first intermediate layer 221 and the EML 223 are very vulnerable to external impurities, such as moisture. Thus, if a portion of the first intermediate layer 221 is removed by irradiating the laser beam onto the first intermediate layer 221 in a state where only the first intermediate layer 221 and the EML 223 are formed without forming the second intermediate layer 222, the first intermediate layer 221 and the EML 223 may be damaged. Thus, the first opening 221' and the second opening 222' may be simultaneously formed by irradiating the laser beam onto the opposite electrode 230 after the second intermediate layer 222 has been formed. For example, when the second intermediate layer 222 includes at least one of LiF and Liq, an ohmic contact of the opposite electrode 230 may be smoothly performed. When the second intermediate layer 222 includes at least one of LiF and Liq, vulnerability to external impurities is improved, and damage of the first intermediate layer 221, the EML 223, and the second intermediate layer 222 may be efficiently prevented when the first opening 221' and the second opening 222' are formed by irradiating the laser beam onto the opposite electrode 230.

Obviously, in order to prevent damage of the first intermediate layer 221, the EML 223 and/or the second intermediate layer 222, after the opposite electrode 230 has been formed, the laser beam is irradiated onto at least a part of the opposite electrode 230 corresponding to the bus electrode 210a, and at least a part of the first intermediate layer 221 and/or the second intermediate layer 222 between the opposite electrode 230 and the bus electrode 210a is removed so that the opposite electrode 230 and the bus electrode 210a contact each other. Even in this case, the organic light emitting display apparatus may have the structure illustrated in FIG. 7.

An organic light emitting display apparatus according to another embodiment of the present disclosure may have the configuration illustrated in FIG. 12. That is, the organic light emitting display apparatus may further include an auxiliary opposite electrode 231 formed on a surface in a direction of the first intermediate layer 221 of the opposite electrode 230 to contact the opposite electrode 230 and that has a third opening 231' corresponding to the first opening 221' of the first intermediate layer 221. That is, the auxiliary opposite electrode 231 may correspond to the opposite electrode 230 in a portion of the first intermediate layer 221 not including the first opening 221'. The organic light emitting display apparatus according to the present embodiment may prevent or minimize an IR drop of the opposite electrode 230 via the bus electrode 210a. When the first opening 221' and/or the second opening 222' is formed in the first intermediate layer 221 and/or the second intermediate layer 222, the first intermediate layer 221, the EML 223 and/or the second intermediate layer 222, which are formed below the auxiliary opposite electrode 231, are protected by the auxiliary opposite electrode 231 so that damage of the first intermediate layer 221, the EML 223 and/or the second intermediate layer 222 may be efficiently prevented. The thickness of the auxiliary opposite electrode 231 may be smaller than the thickness of the opposite electrode 230.

The auxiliary opposite electrode 231 and the opposite electrode 230 may be formed as an integral part in some embodiments as illustrated in FIG. 13. It will be understood that the thickness t2 of a portion of the opposite electrode 230 corresponding to the first opening 221' of the first intermediate layer 221 is smaller than the thickness t1 of another portion of the opposite electrode 230, for example, the thickness t1 of a portion of the pixel electrode 210.

As described above, according to the one or more embodiments of the present disclosure, an organic light emitting display apparatus that can be easily manufactured and has high luminous stability and a method of manufacturing the same are provided. Obviously, the scope of the present disclosure is not limited by the effects.

While the present invention has been particularly shown and described with reference to exemplary embodiments thereof, it will be appreciated by those skilled in the art that various modifications and changes may be made without departing from the scope of the present disclosure. It will also be appreciated by those of skill in the art that parts included in one embodiment are interchangeable with other embodiments; one or more parts from a depicted embodiment can be included with other depicted embodiments in any combination. For example, any of the various components described herein and/or depicted in the Figures may be combined, interchanged or excluded from other embodiments. With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. Thus, while the present disclosure has described certain exemplary embodiments, it will be understood by those of ordinary skill in the art that various changes in form and details may be made therein without departing from the spirit and scope of the present invention as defined by the following claims.

What is claimed is:

1. An organic light emitting display apparatus, comprising:
    a pixel electrode and a bus electrode on a same layer, spaced apart, and electrically insulated from each other;
    a pixel defining layer on the same layer so that at least a part of the pixel electrode including a central part thereof and at least a part of the bus electrode are exposed;
    a first intermediate layer on a top surface of the pixel defining layer between the pixel electrode and the bus electrode, and on the pixel electrode, the first intermediate layer having a first opening in a part of the bus electrode so that at least a part of a top surface of the bus electrode is exposed;
    an emission layer on the first intermediate layer and over the pixel electrode; and
    an opposite electrode over the emission layer corresponding to both the pixel electrode and the bus electrode, the opposite electrode contacting the bus electrode through the first opening of the first intermediate layer on the top surface of the bus electrode such that the opposite electrode completely covers the exposed portion of the bus electrode.

2. The organic light emitting display apparatus of claim 1, wherein only a part of the bus electrode is exposed through the first opening of the first intermediate layer.

3. The organic light emitting display apparatus of claim 1, wherein a portion of the first intermediate layer adjacent to the first opening is a portion that has deteriorated from exposure to heat.

4. The organic light emitting display apparatus of claim 1, further comprising an auxiliary opposite electrode on a surface toward the first intermediate layer of the opposite electrode to contact the opposite electrode, the auxiliary opposite electrode having a third opening corresponding to the first opening of the first intermediate layer.

5. The organic light emitting display apparatus of claim 1, wherein a thickness of a portion of the opposite electrode corresponding to the first opening of the first intermediate layer is smaller than the thickness of another portion of the opposite electrode.

6. The organic light emitting display apparatus of claim 1, further comprising a second intermediate layer between the first intermediate layer and the opposite electrode to cover the first intermediate layer and the emission layer, the second intermediate layer having a second opening corresponding to the first opening of the first intermediate layer so that the opposite electrode contacts the bus electrode through the first opening and the second opening.

7. The organic light emitting display apparatus of claim 1, wherein only the part of the top surface of the bus electrode is exposed through the first opening, and wherein the opposite electrode contacts the bus electrode without contacting side surfaces of the bus electrode.

8. The organic light emitting display apparatus of claim 4, wherein a thickness of the auxiliary opposite electrode is smaller than the thickness of the opposite electrode.

9. The organic light emitting display apparatus of claim 4, wherein the auxiliary opposite electrode corresponds to the opposite electrode in a portion of the first intermediate layer not including the first opening.

10. The organic light emitting display apparatus of claim 6, wherein the second opening is larger than the first opening.

11. The organic light emitting display apparatus of claim 6, wherein a portion of the second intermediate layer adjacent to the second opening is a portion deteriorated from heat exposure.

12. The organic light emitting display apparatus of claim 6, wherein the second intermediate layer includes at least one of LiF and Liq.

13. The organic light emitting display apparatus of claim 10, wherein a center of the second opening and a center of the first opening are substantially aligned with each other when viewed from a direction normal to both the first opening and the second opening.

\* \* \* \* \*